US006853010B2

(12) United States Patent
Slater, Jr. et al.

(10) Patent No.: US 6,853,010 B2
(45) Date of Patent: Feb. 8, 2005

(54) PHOSPHOR-COATED LIGHT EMITTING DIODES INCLUDING TAPERED SIDEWALLS, AND FABRICATION METHODS THEREFOR

(75) Inventors: David B. Slater, Jr., Raleigh, NC (US); Gerald H. Negley, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/659,241

(22) Filed: Sep. 9, 2003

(65) Prior Publication Data

US 2004/0056260 A1 Mar. 25, 2004

Related U.S. Application Data

(60) Provisional application No. 60/411,980, filed on Sep. 19, 2002.

(51) Int. Cl.[7] .............................................. H01L 33/00
(52) U.S. Cl. .......................................... 257/98; 257/95
(58) Field of Search ..................................... 257/95, 98

(56) References Cited

U.S. PATENT DOCUMENTS

| | | | |
|---|---|---|---|
| 4,042,552 A | 8/1977 | Grucza | |
| 4,107,238 A | 8/1978 | Roper et al. | |
| 4,141,941 A | 2/1979 | Travnicek | |
| 4,562,018 A | 12/1985 | Neefe | |
| 4,826,424 A | 5/1989 | Arai et al. | |
| 4,918,497 A | 4/1990 | Edmond | |

(List continued on next page.)

FOREIGN PATENT DOCUMENTS

| | | |
|---|---|---|
| JP | 5-152609 A | 6/1993 |
| JP | 6-151974 A | 5/1994 |
| JP | 6-177429 A | 6/1994 |
| JP | 6-244458 A | 9/1994 |
| JP | 8-162676 A | 6/1996 |
| JP | 9-246603 A | 9/1997 |
| JP | 10-242513 A | 9/1998 |
| JP | 11-261114 A | 9/1999 |
| JP | 11-298047 A | 10/1999 |
| JP | 2000-101147 A | 4/2000 |
| JP | 2000-174347 A | 6/2000 |
| JP | 2000-183405 A | 6/2000 |
| JP | 2000-286455 A | 10/2000 |
| JP | 2000-286458 A | 10/2000 |
| JP | 2001-77427 A | 3/2001 |
| JP | 2001-77433 A | 3/2001 |
| JP | 2001-144334 A | 5/2001 |
| JP | 2001-230453 A | 8/2001 |
| JP | 2002-118293 A | 4/2002 |
| JP | 2002-158378 A | 5/2002 |
| JP | 2002-223004 A | 8/2002 |
| JP | 2002-280616 A | 9/2002 |
| JP | 2003-17755 A | 1/2003 |
| WO | WO 02/059982 A1 | 8/2002 |

OTHER PUBLICATIONS

Craford, *Overview of Device Issues in High–Brightness Light–Emitting Diodes*, Chapter, *High Brightness Light Emitting Diodes: Semiconductors and Semimetals*, vol. 48, Stringfellow et al. ed., Academic Press, 1997, pp. 47–63.
Loh, *Power Surface Mount Light Emitting Die Package*, USSN 10/446,532, May 27, 2003.
International Search Report, PCT/US03/27912, Jan. 30, 2004.

*Primary Examiner*—Jerome Jackson
(74) *Attorney, Agent, or Firm*—Myers Bigel Sibley & Sajovec

(57) ABSTRACT

A light emitting diode includes a substrate having first and second opposing faces and a sidewall between the first and second opposing faces that extends at an oblique angle from the second face towards the first face. A conformal phosphor layer is provided on the oblique sidewall. The oblique sidewall can allow more uniform phosphor coatings than conventional orthogonal sidewalls.

53 Claims, 1 Drawing Sheet

U.S. PATENT DOCUMENTS

| | | |
|---|---|---|
| 4,966,862 A | 10/1990 | Edmond |
| 5,027,168 A | 6/1991 | Edmond |
| 5,087,949 A | 2/1992 | Haitz |
| 5,110,278 A | 5/1992 | Tait et al. |
| 5,143,660 A | 9/1992 | Hamilton et al. |
| 5,210,051 A | 5/1993 | Carter, Jr. |
| 5,277,840 A | 1/1994 | Osaka et al. |
| 5,338,944 A | 8/1994 | Edmond et al. |
| 5,374,668 A | 12/1994 | Kanemura et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,753,730 A | 5/1998 | Nagata et al. |
| 5,813,753 A | 9/1998 | Vriens et al. |
| 5,858,278 A | 1/1999 | Itoh et al. |
| 5,882,553 A | 3/1999 | Prophet et al. |
| 5,912,477 A | 6/1999 | Negley |
| 5,959,316 A | 9/1999 | Lowery |
| 5,968,422 A | 10/1999 | Kennedy |
| 6,069,440 A | 5/2000 | Shimizu et al. |
| 6,120,600 A | 9/2000 | Edmond et al. |
| 6,156,242 A | 12/2000 | Saito et al. |
| 6,177,688 B1 | 1/2001 | Linthicum et al. |
| 6,187,606 B1 | 2/2001 | Edmond et al. |
| 6,201,262 B1 | 3/2001 | Edmond et al. |
| 6,252,254 B1 | 6/2001 | Soules et al. |
| 6,329,676 B1 | 12/2001 | Takayama et al. |
| 6,373,188 B1 | 4/2002 | Johnson et al. |
| 6,383,417 B1 | 5/2002 | Paulson et al. |
| 6,391,231 B1 | 5/2002 | Evans et al. |
| 6,404,125 B1 | 6/2002 | Garbuzov et al. |
| 2001/0050371 A1 * | 12/2001 | Odaki et al. .................. 257/98 |
| 2002/0123164 A1 | 9/2002 | Slater, Jr. et al. |
| 2003/0006418 A1 | 1/2003 | Emerson et al. |
| 2003/0173575 A1 | 9/2003 | Eisert et al. |

\* cited by examiner

PHOSPHOR-COATED LIGHT EMITTING DIODES INCLUDING TAPERED SIDEWALLS, AND FABRICATION METHODS THEREFOR

CROSS-REFERENCE TO PROVISIONAL APPLICATION

This application claims the benefit of provisional Application No. 60/411,980, filed Sep. 19, 2002, entitled Phosphor-Coated Light Emitting Diodes Including Tapered Sidewalls, and Fabrication Methods Therefor, assigned to the assignee of the present application, the disclosure of which is hereby incorporated herein by reference in its entirety as if set forth fully herein.

FIELD OF THE INVENTION

This invention relates to microelectronic devices and fabrication methods therefor, and more particularly to light emitting diodes (LEDs) and fabrication methods therefor.

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, silicon, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

One measure of efficiency of LEDs is the cost per lumen. The cost per lumen for an LED may be a function of the manufacturing cost per LED chip, the internal quantum efficiency of the LED material and the ability to couple or extract the generated light out of the device. An overview of light extraction issues may be found in the textbook entitled *High Brightness Light Emitting Diodes* to Stringfellow et al., Academic Press, 1997, and particularly Chapter 2, entitled *Overview of Device Issues in High-Brightness Light Emitting Diodes*, to Craford, at pp. 47–63.

Light extraction has been accomplished in many ways, depending, for example, on the materials that are used to fabricate the diode region and the substrate. For example, in gallium arsenide and gallium phosphide material systems, a thick, p-type, topside window layer may be used for light extraction. The p-type window layer may be grown because high epitaxial growth rates may be possible in the gallium arsenide/gallium phosphide material systems using liquid and/or vapor phase epitaxy. Moreover, current spreading may be achieved due to the conductivity of the p-type topside window layer. Chemical etching with high etch rates and high etch selectivity also may be used to allow the removal of at least some of the substrate if it is optically absorbent. Distributed Bragg reflectors also have been grown between an absorbing substrate and the diode region to decouple the emitting and absorbing regions.

Other approaches for light extraction may involve mechanical shaping or texturing of the diode region and/or the substrate. However, it may be desirable to provide other light extraction techniques that can allow further improvements in extraction efficiency. Moreover, it may be desirable to increase the area of an LED chip from about 0.1 mm$^2$ to larger areas, to thereby provide larger LEDs. Unfortunately, the effectiveness of these shaping techniques may not be maintained as the chip dimensions are scaled up for higher power/intensity and/or other applications.

Much development interest and commercial activity recently has focused on LEDs that are fabricated in and/or on silicon carbide, because these LEDs can emit radiation in the blue/green portions of the visible spectrum. See, for example, U.S. Pat. No. 5,416,342 to Edmond et al., entitled Blue Light-Emitting Diode With High External Quantum Efficiency, assigned to the assignee of the present application, the disclosure of which is hereby incorporated herein by reference in its entirety as if set forth fully herein. There also has been much interest in LEDs that include gallium nitride-based diode regions on silicon carbide substrates, because these devices also may emit light with high efficiency. See, for example, U.S. Pat. No. 6,177,688 to Linthicum et al., entitled Pendeoepitaxial Gallium Nitride Semiconductor Layers On Silicon Carbide Substrates, the disclosure of which is hereby incorporated herein by reference in its entirety as if set forth fully herein.

In such silicon carbide LEDs and/or gallium nitride LEDs on silicon carbide, it may be difficult to use conventional techniques for light extraction. For example, it may be difficult to use thick p-type window layers because of the relatively low growth rate of gallium nitride. Also, although such LEDs may benefit from the use of Bragg reflectors and/or substrate removal techniques, it may be difficult to fabricate a reflector between the substrate and the gallium nitride diode region and/or to remove at least part of the silicon carbide substrate.

U.S. Pat. No. 4,966,862 to Edmond, entitled Method of Production of Light Emitting Diodes, assigned to the assignee of the present application, the disclosure of which is hereby incorporated herein by reference in its entirety as if set forth fully herein, describes a method for preparing a plurality of light emitting diodes on a single substrate of a semiconductor material. The method is used for structures where the substrate includes an epitaxial layer of the same semiconductor material that in turn comprises layers of p-type and n-type material that define a p-n junction therebetween. The epitaxial layer and the substrate are etched in a predetermined pattern to define individual diode precursors, and deeply enough to form mesas in the epitaxial layer that delineate the p-n junctions in each diode precursor from one another. The substrate is then grooved from the side of the epitaxial layer and between the mesas to a predetermined depth to define side portions of diode precursors in the substrate while retaining enough of the substrate beneath the grooves to maintain its mechanical stability. Ohmic contacts are added to the epitaxial layer and to the substrate and a layer of insulating material is formed on the diode precursor. The insulating layer covers the portions of the epitaxial layer that are not covered by the ohmic contact, any portions of the one surface of the substrate adjacent the mesas, and the side portions of the substrate. As a result, the junction and the side portions of the substrate of each diode are insulated from electrical contact other than through the ohmic contacts. When the diodes are separated they can be conventionally mounted with the junction side down in a conductive epoxy without concern that the epoxy will short circuit the resulting diode. See the abstract of U.S. Pat. No. 4,966,862.

U.S. Pat. No. 5,210,051 to Carter, Jr., entitled High Efficiency Light Emitting Diodes From Bipolar Gallium Nitride, assigned to the assignee of the present application, the disclosure of which is hereby incorporated herein by reference in its entirety as if set forth fully herein, describes a method of growing intrinsic, substantially undoped single crystal gallium nitride with a donor concentration of $7 \times 10^{17}$ $cm^{-3}$ or less. The method comprises introducing a source of nitrogen into a reaction chamber containing a growth surface while introducing a source of gallium into the same reaction chamber and while directing nitrogen atoms and gallium atoms to a growth surface upon which gallium nitride will grow. The method further comprises concurrently maintaining the growth surface at a temperature high enough to provide sufficient surface mobility to the gallium and nitrogen atoms that strike the growth surface to reach and move into proper lattice sites, thereby establishing good crystallinity, to establish an effective sticking coefficient, and to thereby grow an epitaxial layer of gallium nitride on the growth surface, but low enough for the partial pressure of nitrogen species in the reaction chamber to approach the equilibrium vapor pressure of those nitrogen species over gallium nitride under the other ambient conditions of the chamber to thereby minimize the loss of nitrogen from the gallium nitride and the nitrogen vacancies in the resulting epitaxial layer. See the abstract of U.S. Pat. No. 5,210,051.

The coating of a phosphor on an LED may further complicate light extraction problems. In particular, it may be desirable to provide a phosphor for an LED, for example to provide solid-state lighting. In one example, LEDs that are used for solid-state white lighting may produce high radiant flux output at short wavelengths, for example in the range of about 380 nm to about 480 nm. One or more phosphors may be provided, wherein the short wavelength, high energy photon output of the LED is used to excite the phosphor, in part or entirely, to thereby down-convert in frequency some or all of the LED's output to create white light.

As one specific example, ultraviolet output from an LED at about 390 nm may be used in conjunction with red, green and blue phosphors, to create white light. As another specific example, blue light output at about 470 nm from an LED may be used to excite a yellow phosphor, to create white light by transmitting some of the 470 nm blue output along with some secondary yellow emission occurring when part of the LEDs output is absorbed by the phosphor.

As is well known to those having skill in the art, at least two techniques may be used to incorporate phosphor material into a light emission path of an LED. In one technique, the phosphor may be suspended in the packaging and/or encapsulation that is provided with the LED, so that the phosphor is maintained in proximity to the LED. In an alternative approach, the phosphor material is coated on the LED itself. When coating a phosphor, a liquid binder, such as an epoxy, may be used, in which one or more phosphors is suspended. The phosphor-containing binder may be dispensed onto the LED prior to dispensing and curing a clear encapsulation epoxy. LEDs that employ phosphor coatings are described, for example, in U.S. Pat. Nos. 6,252,254; 6,069,440; 5,858,278; 5,813,753; and 5,277,840.

In view of the above discussion, improved light extraction techniques may be desirable for LEDs, especially LEDs that are fabricated from silicon carbide, that are fabricated from gallium nitride on silicon carbide and/or that include a phosphor coating.

SUMMARY OF THE INVENTION

Light emitting diodes according to some embodiments of the invention include a substrate having first and second opposing faces, and a diode region on the first face. The sidewall(s) of the light emitting diode extend at an oblique angle, rather than a 90° angle, from the second face towards the first face. In some embodiments, the oblique angle is an obtuse angle. In some embodiments, the oblique sidewall may extend from the second face to adjacent the diode region. A conformal phosphor-containing layer is included on at least a portion of the oblique sidewall. In other embodiments, the phosphor-containing layer is also included on the second face. According to some embodiments of the invention, by providing an oblique sidewall adjacent the second face, more uniform phosphor-containing coatings may be obtained compared to light emitting diodes that have a vertical (orthogonal) sidewall adjacent the second face.

Light emitting diodes may be fabricated, according to some embodiments of the present invention, by conformally coating a sidewall, which extends at an oblique angle from a second face of a substrate towards a first face of the substrate, with a layer containing phosphor. The second face also may be conformally coated.

DETAILED DESCRIPTION

Figure 1A:
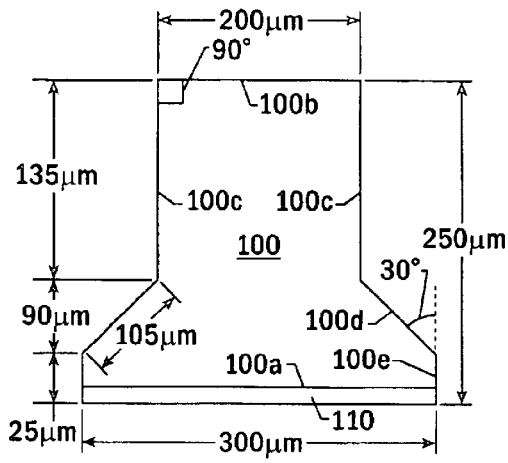
FIG. 1A is a cross-sectional view of a light emitting diode including a vertical sidewall adjacent a second face thereof.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

Embodiments of the invention now will be described, generally with reference to gallium nitride-based light emitting diodes on silicon carbide-based substrates. However, it will be understood by those having skill in the art that many embodiments of the invention may be employed with any combination of a substrate that is non-absorbing or transparent to the emitted light. In some embodiments, the refractive index of the substrate is greater than that of the diode. Accordingly, combinations can include an AlGaInP diode on a GaP substrate; an InGaAs diode on a GaAs substrate; an AlGaAs diode on a GaAs substrate; an SiC diode on an SiC Substrate, an SiC diode on a sapphire ($Al_2O_3$) substrate; and/or a nitride-based diode on a gallium nitride, silicon carbide, aluminum nitride, zinc oxide and/or other substrate.

Many examples of such LEDs are described in application Ser. No. 10/057,821, filed Jan. 25, 2002, to Slater, Jr. et al., entitled Light Emitting Diodes Including Substrate Modifications for Light Extraction and Manufacturing Methods Therefor, assigned to the assignee of the present application, the disclosure of which is hereby incorporated herein by reference in its entirety as if set forth fully herein.

FIG. 1A is a cross-sectional view of LEDs with orthogonal sidewalls adjacent a second face thereof. In particular, referring to FIG. 1A, these LEDs include a substrate 100, such as a silicon carbide substrate 100, having first and second opposing faces 100a and 100b, that is transparent to optical radiation in a predetermined wavelength range. As used herein, the term "transparent" means that optical radiation in the predetermined wavelength range can pass through the material without being totally absorbed or totally reflected. A diode region 110 is on the first face, and is configured to emit light in the predetermined wavelength into the substrate 100 upon application of voltage across the diode region 110. The diode region 110 may comprise silicon carbide, gallium nitride and/or other materials, such as is described in the aforementioned application Ser. No. 10/057,821.

Still referring to FIG. 1A, the substrate 100 includes one or more sidewalls that include a first portion 100c that is adjacent the second face 100b and is orthogonal thereto, as shown by the 90° angle in FIG. 1A. A second portion 100e, adjacent the first face 100a, is orthogonal thereto. A third portion 100d between the first and second portions 100c and 100e is oblique, making an angle of, for example, 30° with an extension of the second portion 100e. Although FIG. 1A is not drawn to scale, dimensions for one embodiment are illustrated in FIG. 1A. Thus, in the embodiment illustrated in FIG. 1A, the first face may be about 300 μm wide, and the second face may be about 200 μm wide. The first portion 100c of the sidewall may be about 135 μm thick, the second portion 100e of the sidewall may be about 25 μm thick, and the oblique portion 100d of the sidewall may be about 90 μm thick, so that the surface of the oblique portion 100d is about 105 μm long. The total thickness of the LED is about 250 μm.

Figure 1B:
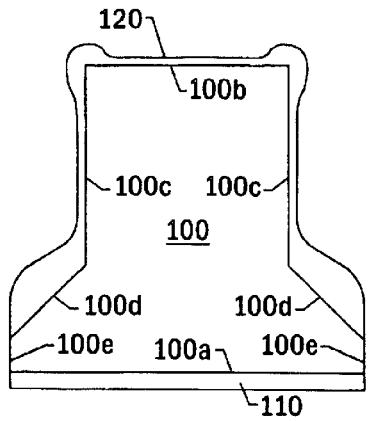
FIG. 1B is a cross-sectional view of a light emitting diode including a vertical sidewall adjacent a second face thereof that is coated with a phosphor-containing layer.

Referring now to FIG. 1B, LEDs of FIG. 1A including a phosphor-containing coating 120 are shown. As shown in FIG. 1B, it may be difficult to coat the second face 100b or the first (vertical) portion 100c of the sidewall as thick as the third (oblique) portion 100d of the sidewall. More specifically, in order to obtain sufficient coverage on the first (vertical) portion 100c of the sidewall, excess phosphor-containing binder may be used, which may still provide poor coverage on the second face 100b, and may also cause excessive amounts of the phosphor-containing binder to flow down onto the third (oblique) portion 100d of the sidewall. The poor coverage of the phosphor-containing coating 120 on the second face 100b may allow too much blue emission to be radiated directly from the LED without passing through any or enough of the absorbing yellow phosphor. Moreover, the excessive amount of phosphor that may flow down onto the third (oblique) portion 100d of the sidewall may result in too little blue emission from the lower portion of the LED. The secondary yellow emission may occur underneath the excessively thick layer of phosphor-containing binder on the third (oblique) portion 100d of the sidewall, yet is absorbed by the upper portion of the phosphor-containing binder which may result in reduced conversion efficiency for the phosphor-coated LED and/or may result in large angular dependence by Color Correlated Temperature (CCT).

Figure 2A:
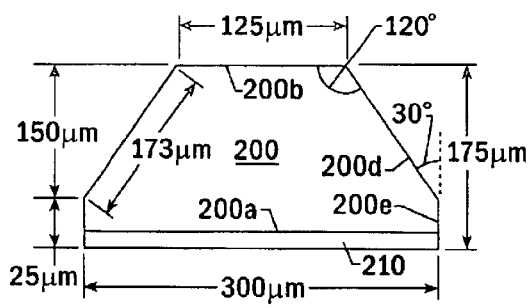
FIG. 2A is a cross-sectional view of an LED that includes an oblique sidewall adjacent the second face thereof according to some embodiments of the present invention.
Figure 2B:
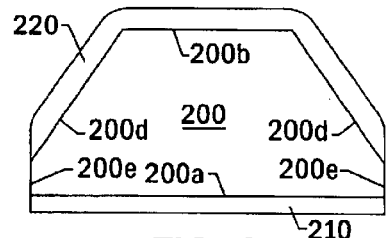
FIG. 2B is a cross-sectional view of an LED that includes an oblique sidewall adjacent the second face thereof that is coated with a uniform thickness phosphor-containing layer according to some embodiments of the present invention.
Figure 2C:
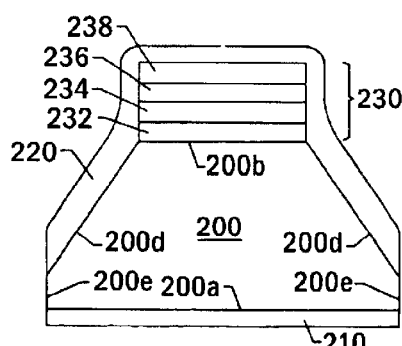
FIG. 2C is a cross-sectional view of an LED that includes an oblique sidewall adjacent the second face thereof including a multi-layer contact structure, and that is coated with a uniform thickness phosphor-containing coating according to some embodiments of the present invention.

Some embodiments of the present invention, which are described in FIGS. 2A–2C, can allow at least some of the emitting surfaces of an LED to be covered with a nearly conformal phosphor-containing layer of substantially uniform thickness. This more conformal coverage can produce a desired spectrum of light, while also allowing more radiant flux to be emitted from the phosphor-coated LED.

FIG. 2A is a cross-sectional view of LEDs according to some embodiments of the present invention. As shown in FIG. 2A, these LEDs include a semiconductor substrate, such as a silicon carbide substrate, having first and second opposing faces 200a and 200b, that is transparent to optical radiation in a predetermined wavelength range. A diode region 210 is on the first face 200a, and is configured to emit light in a predetermined wavelength range into the substrate 200, upon application of voltage across the diode region 210. The diode region 210 may comprise silicon carbide, gallium nitride and/or other materials, such as is described in the aforementioned application Ser. No. 10/057,821.

As also shown in FIG. 2A, at least one sidewall of the LED includes a first oblique portion 200d adjacent the second face. The oblique portion 200d forms a non-orthogonal angle, for example an obtuse angle such as an angle of 120°, with the second face 200b. In some embodiments, the oblique portion 200d may extend from the second face 200b adjacent or all the way to the first face 200a. In other embodiments, a second orthogonal portion 200e may be present adjacent the first face 200a. In some embodiments, the oblique portion 200d is a planar oblique portion, to provide a continuous taper that extends from the second face 200b towards the first face 200a and, in some embodiments, from the second face 200b all the way to the first face 200a. In other embodiments, the oblique portion 200d may be curved (nonplanar), include multiple planar segments, and/or be textured.

Although FIG. 2A is not drawn to scale, dimensions for one embodiment of the present invention are shown. In particular, the first face 200a may be about 300 μm wide, whereas the second face 200b may be about 125 μm wide. The first: oblique portion 200d of the sidewall may be about 150 μm thick, to provide a surface length of about 173 μm. The second orthogonal portion 200e may be about 25 μm in thickness. Accordingly, the total thickness of the LED may be about 175 μm.

The fabrication of LEDs with an oblique sidewall adjacent the second face is well known to those having skill in the art, and is described, for example, in U.S. Pat. No. 5,087,949, the disclosure of which is hereby incorporated herein by reference in its entirety as if set forth fully herein.

Comparing embodiments of FIGS. 2A and 1A with the dimensions shown in these figures, LEDs of FIG. 2A have a lower (flatter) profile, and a continuous tapered oblique sidewall portion 200d from the second face 200b almost to the first face 200a. Stated differently, there is no post with first vertical portions 100c. Embodiments of FIG. 2A may be fabricated using a thinner silicon carbide substrate than used for embodiments of FIG. 1A. In particular, substrates 100 as illustrated in FIG. 1A may be about 250 µm thick, whereas substrates 200 in some embodiments of the present invention as illustrated in FIG. 2A may be about 175 µm thick. It will be understood, however, that in other embodiments, the substrate need not be thinner, and the taper angle and/or other parameters may be adjusted accordingly.

In addition, a saw blade that is used for the saw/break process with an LED of FIG. 1A that is fabricated on a 300 µm pitch, may be about 100 µm wide. The tapered facet created by the saw in FIG. 1A (third portion 100d) and in embodiments of the present invention as shown in FIG. 2A (first oblique portion 200d), may be about 30° from normal relative to the first face 100a, 200a. However, the width of the saw blade in some embodiments of the present invention as shown in FIG. 2A may be about 175 µm wide. The wider blade and the thinner substrate 200 can produce a continuously tapered first oblique portion 200d of the sidewall starting at the second face 200b where the wire bond is formed and extending to the first face 200a, within about 20 µm to about 30 µm, shown in FIG. 2A as within about 25 µm. In both FIGS. 1A and 2A, the bottom 20 µm to 30 µm adjacent the first face 100a, 200a is relatively vertical, as these portions 100e/200e may be broken through to singulate the die.

Continuing with the comparison of FIG. 2A and FIG. 1A, in some embodiments, the first face 200b of FIG. 2A is 125 µm², whereas the first face 100b of FIG. 1A is about 200 µm² atop a vertical post that is between about 130 and 140 µm (shown as 135 µm in FIG. 1A) tall. The first oblique portion 200d has a total length of about 173 µm in FIG. 2A, whereas the intermediate tapered portion 100d has a total length of about 105 µm. Looking at the height dimension, the first oblique portion 200d is about 150 µm of 175 µm total height in FIG. 2A, whereas in FIG. 1A, the third portion 100d is about 90 µm of the 250 µm total height.

Referring now to FIG. 2B, a phosphor-containing layer 220 is coated on the oblique sidewall 200d and also may be coated on the second face 200b. In some embodiments, the phosphor-containing layer may include a binder, such as an epoxy, a silicon-based matrix and/or other solvent. The phosphor may be cerium-doped YAG and/or other conventional phosphors. However, other conventional binders and/or phosphors may be used depending on the application. The phosphor may be coated on the LED by screen printing, evaporation (sputter, e-beam, thermal, CVD, electrostatic and/or electrophoretic deposition), dipping, spin coating and/or other techniques. The phosphor-containing layer 220 then may be cured at between about 50° C. and about 200° C. for about several seconds to several hours. The thickness of the phosphor-containing layer 220 may range between about 2 µm and about 100 µm, in some embodiments of the invention. However, other thicknesses may be used. The thickness that is used may be selected to reduce or minimize self-absorption sand/or scattering and may depend on the coating process, the density of the phosphor and/or the desired application. Moreover, a coating process or combinations of coatings processes may be selected to control the thickness of the phosphor on the oblique sidewall 200d compared to the second face 200b.

The oblique portion 200d of the sidewall can improve the uniformity of the phosphor-containing layer 220, as shown in FIG. 2B. This can improve the light conversion compared to LEDs of FIG. 1B.

In some embodiments, the increased light output for embodiments of FIG. 2B can be between about 10% and about 15% compared to embodiments of FIG. 1B. In addition to the increased power or radiant flux, embodiments of the invention as shown in FIG. 2B can have no substantial vertical sidewall except for the second portion 200e through which the die are broken. This, in conjunction with the reduced height, can allow uniform phosphor coverage to be obtained over the entire first oblique portion 200d and/or over the first oblique portion 200d and the second face 200b. Accordingly, improved blue and yellow transmission conversion efficiency can provide improved color rendering of a white light source in some embodiments of the present invention, compared to embodiments of FIG. 1B. Moreover, by reducing the thickness of the substrate, improved (lowered) static resistance of the LED may be obtained, which can lead to improved in-the-wall plug efficiency. Finally, it will be understood that parameters of the oblique portion 200d, such as length, angle and/or topography may be adjusted to provide a desired light output with a given phosphor and/or coating process.

FIG. 2C illustrates other embodiments of the present invention, including a reflective substrate contact 230 on the second face 200b of the substrate 200. As shown in FIG. 2C, in some embodiments, the substrate contact 230 can completely cover the second face 200b. This can reduce or eliminate the possibility of transmitting light directly from the LED without passing through any of the phosphor-containing layer 220. A contact 230 that covers the entire second face 200b may also reduce the tendency to over-dispense the binder, in order to complete coverage of the second face 200b. It will be understood that, in other embodiments of the invention, the substrate contact 230 need not cover the entire second face 200b. In some embodiments of the present invention, the phosphor-containing layer 220 need not be present on the substrate contact 230, or may be present in reduced thickness, compared to the first oblique portion 200d, as shown in FIG. 2C. At least some of the phosphor-containing layer 220 may be removed from the contact 230, using conventional techniques. It also will be understood that some embodiments of the invention may be used in a suspended phosphor packaging to enhance the light extraction from the LED into the suspended phosphor, by, for example, blocking emission from the second face 200b and only allowing emission from the oblique portion 200d.

It also will be understood that coverage of the substrate contact 230 on the entire second face 200b may reduce the light output compared to a substrate contact that only covers a portion of the second face 200b. Referring again to FIG. 2C, in some embodiments, a multilayer contact 230 may be provided, including a reflective layer, can at least partially compensate for this loss. For example, some substrate contacts according to embodiments of the present invention may include an ohmic layer 232 comprising, for example, about 25 Å of nickel, a reflector layer 234 comprising, for example, about 1000 Å of silver and/or aluminum, a barrier layer 236 comprising, for example, about 500 Å of platinum and/or TiN, and a bonding layer 238 comprising about 10,000 Å of gold. This may be contrasted with other contact/bond pads that may include titanium, platinum and gold layers. It has been found, according to some embodiments of the invention, that the loss in light output from a conventional contact may arise from the poor reflectivity of the titanium layer at the interface with the second face 200b. In sharp contrast, according to some embodiments of the invention, the ohmic layer comprising nickel between the second face 200b and the reflective layer 234 can be made very thin, for example between about 25 Å thick, in order to reduce losses. Other contact structures that may be employed are described in the aforementioned application Ser. No. 10/057,821.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A Light Emitting Diode (LED) comprising:
   a semiconductor substrate having first and second opposing faces and a sidewall therebetween that extends at an oblique angle from the second face towards the first face; and
   a conformal layer comprising phosphor on the sidewall that extends at an oblique angle from the second face towards the first face.

2. An LED according to claim 1 wherein the oblique angle is an obtuse angle.

3. An LED according to claim 2 wherein the obtuse angle is about 120°.

4. An LED according to claim 1 wherein the sidewall extends at an oblique angle from the second face to adjacent the first face.

5. An LED according to claim 1 wherein the sidewall extends at an oblique angle from the second face to the first face.

6. An LED according to claim 1 wherein the sidewall is a planar sidewall.

7. A Light Emitting Diode (LED) comprising:
   a substrate having first and second opposing faces, and a sidewall therebetween that extends at an oblique angle from the second face towards the first face;
   a diode region on the first face; and
   a conformal layer comprising phosphor on the sidewall that extends at an oblique angle from the second face towards the first face.

8. A An LED according to claim 7 wherein the substrate comprises silicon carbide and wherein the diode region comprises gallium nitride.

9. A Light Emitting Diode (LED) comprising:
   a substrate having first and second opposing faces and a sidewall therebetween that extends at an oblique angle from the second face towards the first face that also extends orthogonal to the first face from the first face towards the second face; and
   a conformal layer comprising phosphor on the sidewall that extends at an oblique angle from the second face towards the first face.

10. An LED according to claim 7 wherein the substrate and diode region are a total of about 175 μm thick.

11. An LED according to claim 10 wherein the sidewall extends at an oblique angle of about 120° from the second face for about 173 μm to adjacent the first face.

12. An LED according to claim 1 wherein the conformal layer comprising phosphor is between about 2 μm and about 100 μm thick.

13. An LED according to claim 1 wherein the conformal layer comprising phosphor extends along the entire sidewall that extends at an oblique angle from the second face towards the first face.

14. An LED according to claim 1 wherein the conformal layer comprising phosphor also extends on the second face.

15. A Light Emitting Diode (LED) comprising:
   a substrate having first and second opposing faces and a sidewall therebetween that extends at an oblique angle from the second face towards the first face;
   a reflective contact on the second face; and
   a conformal layer comprising phosphor on the sidewall that extends at an oblique angle from the second face towards the first face.

16. An LED according to claim 15 wherein the reflective contact extends on the entire second face.

17. An LED according to claim 15 wherein the conformal layer comprising phosphor extends on the reflective contact opposite the second face.

18. An LED according to claim 17 wherein the conformal layer comprising phosphor is thinner on the reflective contact than on the oblique sidewall.

19. A Light Emitting Diode (LED) comprising:
   a substrate having first and second opposing faces and a planar sidewall therebetween including a first portion that extends at an obtuse angle from the second face to adjacent the first face and a second portion that extends orthogonal to the first face from the first face towards the second face;
   a diode region on the first face;
   a reflective contact on the second face; and
   a conformal layer comprising phosphor on the first portion of the sidewall that extends at an oblique angle from the second face towards the first face.

20. An LED according to claim 19 wherein the substrate comprises silicon carbide and wherein the diode region comprises gallium nitride.

21. An LED according to claim 19 wherein the substrate and diode region are a total of about 175 μm thick, wherein the first portion of the sidewall extends at an obtuse angle of about 120° from the second face for about 173 μm to adjacent the first face and wherein the conformal layer comprising phosphor is between about 2 μm and about 100 μm thick.

22. An LED according to claim 19 wherein the conformal layer comprising phosphor extends on the entire first portion of the sidewall.

23. A method of fabricating Light Emitting Diodes (LED) comprising:
   conformally coating a sidewall, which extends at an oblique angle from a second face of a semiconductor substrate towards a first face of the substrate, with a layer comprising phosphor.

24. A method according to claim 23 wherein conformally coating further comprises conformally coating the second face with the layer comprising phosphor.

25. An LED according to claim 7 wherein the oblique angle is an obtuse angle.

26. An LED according to claim 25 wherein the obtuse angle is about 120°.

27. An LED according to claim 7 wherein the sidewall extends at an oblique angle from the second face to adjacent the first face.

28. An LED according to claim 7 wherein the sidewall extends at an oblique angle from the second face to the first face.

29. An LED according to claim 7 wherein the sidewall is a planar sidewall.

30. An LED according to claim 7 wherein the conformal layer comprising phosphor is between about 2 μm and about 100 μm thick.

31. An LED according to claim 7 wherein the conformal layer comprising phosphor extends along the entire sidewall that extends at an oblique angle from the second face towards the first face.

32. An LED according to claim 7 wherein the conformal layer comprising phosphor also extends on the second face.

33. An LED according to claim 8 wherein the oblique angle is an obtuse angle.

34. An LED according to claim 33 wherein the obtuse angle is about 120°.

35. An LED according to claim 8 wherein the sidewall extends at an oblique angle from the second face to adjacent the first face.

36. An LED according to claim 8 wherein the sidewall extends at an oblique angle from the second face to the first face.

37. An LED according to claim 8 wherein the sidewall is a planar sidewall.

38. An LED according to claim 8 wherein the conformal layer comprising phosphor is between about 2 μm and about 100 μm thick.

39. An LED according to claim 8 wherein the conformal layer comprising phosphor extends along the entire sidewall that extends at an oblique angle from the second face towards the first face.

40. An LED according to claim 8 wherein the conformal layer comprising phosphor also extends on the second face.

41. An LED according to claim 9 wherein the oblique angle is an obtuse angle.

42. An LED according to claim 41 wherein the obtuse angle is about 120°.

43. An LED according to claim 9 wherein the sidewall is a segmented planar sidewall.

44. An LED according to claim 9 wherein the conformal layer comprising phosphor is between about 2 μm and about 100 μm thick.

45. An LED according to claim 9 wherein the conformal layer comprising phosphor extends along the entire sidewall.

46. An LED according to claim 9 wherein the conformal layer comprising phosphor also extends on the second face.

47. An LED according to claim 15 wherein the oblique angle is an obtuse angle.

48. An LED according to claim 47 wherein the obtuse angle is about 120°.

49. An LED according to claim 15 wherein the sidewall extends at an oblique angle from the second face to adjacent the first face.

50. An LED according to claim 15 wherein the sidewall extends at an oblique angle from the second face to the first face.

51. An LED according to claim 15 wherein the sidewall is a planar sidewall.

52. An LED according to claim 15 wherein the conformal layer comprising phosphor is between about 2 μm and about 100 μm thick.

53. An LED according to claim 15 wherein the conformal layer comprising phosphor extends along the entire sidewall that extends at an oblique angle from the second face towards the first face.

* * * * *

UNITED STATES PATENT AND TRADEMARK OFFICE
CERTIFICATE OF CORRECTION

PATENT NO.    : 6,853,010 B2
DATED         : February 8, 2005
INVENTOR(S)   : Slater, Jr. et al.

It is certified that error appears in the above-identified patent and that said Letters Patent is hereby corrected as shown below:

Title page,
Item [56], References Cited, FOREIGN PATENT DOCUMENTS, should include:
-- WO 01/61764 A1   8/2001 --

Signed and Sealed this

Twelfth Day of July, 2005

JON W. DUDAS
*Director of the United States Patent and Trademark Office*